US010455697B2

United States Patent
Kim (10) Patent No.: US 10,455,697 B2
(45) Date of Patent: Oct. 22, 2019

(54) PCB MODULE HAVING MULTI-SIDED HEAT SINK STRUCTURE AND MULTILAYER PCB ASSEMBLY FOR USE IN SAME

(71) Applicant: MDM INC., Daegu (KR)

(72) Inventor: Ku Yong Kim, Incheon (KR)

(73) Assignee: MDM INC., Daegu (KR)

( * ) Notice: Subject to any disclaimer, the term of this patent is extended or adjusted under 35 U.S.C. 154(b) by 0 days.

(21) Appl. No.: 16/249,169

(22) Filed: Jan. 16, 2019

(65) Prior Publication Data

US 2019/0166691 A1     May 30, 2019

Related U.S. Application Data

(63) Continuation of application No. PCT/KR2017/006536, filed on Jun. 21, 2017.

(30) Foreign Application Priority Data

Aug. 8, 2016    (KR) .................. 10-2016-0100758

(51) Int. Cl.
     *H05K 7/20*          (2006.01)
     *H05K 1/05*          (2006.01)
     (Continued)

(52) U.S. Cl.
     CPC ............. *H05K 1/05* (2013.01); *H05K 1/02* (2013.01); *H05K 1/03* (2013.01); *H05K 5/00* (2013.01);
     (Continued)

(58) Field of Classification Search
     CPC ............ H05K 7/20; H05K 1/05; H05K 7/023; H05K 5/03
     (Continued)

(56) References Cited

U.S. PATENT DOCUMENTS 7,369,415 B2    5/2008   Kojima
9,711,430 B2    7/2017   Nishida et al.
(Continued)

FOREIGN PATENT DOCUMENTS

JP      2000-200977 A     7/2000
JP      2004-214429 A     7/2004
(Continued)

OTHER PUBLICATIONS

Korean Office Action dated Feb. 28, 2018 issued in Korean Patent Application No. 10-2016-0100758.
(Continued)

*Primary Examiner* — Sherman Ng
(74) *Attorney, Agent, or Firm* — Harness, Dickey & Pierce, P.L.C.

(57) ABSTRACT

An embodiment of the present invention provides a PCB module comprising: a multilayer PCB assembly including a heat dissipation plate layer, and an upper PCB and a lower PCB which are attached to the upper surface and the lower surface of the heat dissipation plate layer, respectively; and an upper case and a lower case for covering the upper side and the lower side of the multilayer PCB assembly, respectively, wherein the heat dissipation plate layer includes a plurality of electrically insulating heat dissipation plates arranged on the same plane, and at least one of the plurality of heat dissipation plates comprises: a first heat pole in thermal contact with an electronic circuit element mounted on the upper PCB or the lower PCB; and a second heat pole in thermal contact with the inner surface of at least one of the upper and lower cases.

15 Claims, 9 Drawing Sheets

(51) Int. Cl.
*H05K 1/02* (2006.01)
*H05K 1/03* (2006.01)
*H05K 5/00* (2006.01)
*H05K 5/03* (2006.01)
*H05K 7/02* (2006.01)

(52) U.S. Cl.
CPC ............... *H05K 5/03* (2013.01); *H05K 7/023* (2013.01); *H05K 7/20* (2013.01)

(58) Field of Classification Search
USPC .................................. 174/252, 258; 361/709
See application file for complete search history.

(56) References Cited

U.S. PATENT DOCUMENTS

| | | | |
|---|---|---|---|
| 2003/0201120 A1* | 10/2003 | Forte | H05K 7/142 |
| | | | 174/255 |
| 2005/0174748 A1* | 8/2005 | Kojima | H05K 1/189 |
| | | | 361/796 |
| 2011/0188207 A1* | 8/2011 | Won | G06F 1/20 |
| | | | 361/709 |

FOREIGN PATENT DOCUMENTS

| | | |
|---|---|---|
| JP | 2004-363183 A | 12/2004 |
| JP | 2005-229092 A | 8/2005 |
| JP | 2011-009522 A | 1/2011 |
| KR | 10-2005-0080099 A | 8/2005 |

OTHER PUBLICATIONS

International Search Report from corresponding PCT Application No. PCT/KR2017/006536, dated Oct. 19, 2017, with English translation.

English Translation of Korean Office Action dated Feb. 28, 2018 issued in Korean Patent Application No. 10-2016-0100758.

\* cited by examiner

PCB MODULE HAVING MULTI-SIDED HEAT SINK STRUCTURE AND MULTILAYER PCB ASSEMBLY FOR USE IN SAME

CROSS-REFERENCE TO RELATED APPLICATIONS

This application is a continuation application of PCT Application No. PCT/KR2017/006536, filed on 21 Jun. 2017, which claims benefit of Korean Patent Application 10-2016-0100758, filed on 8 Aug. 2016. The entire disclosure of the applications identified in this paragraph are incorporated herein by reference.

FIELD

The present disclosure relates to a multilayer printed circuit board (PCB) module, and more particularly, to a PCB module having a multi-directional heat-radiation structure, which can effectively discharge heat generated in a multi-layered PCB to the outside, and a multilayer PCB assembly used in the same.

The present disclosure was supported by National Research and Development Project Business as follows:

{National Research and Development Project Business Supporting the Present Disclosure}

[Project Number] B0132-15-1006

[Related Department] Ministry of Science, ICT & Future Planning

[Research Management Specialized Agency] Institute for Information & Communications Technology Promotion (IITP)

[Research Project Business Title] Research and Development Support Business of Electronics and Telecommunications Research Institute

[Research Project Title] Development of Core Components and Module for Base Station/Terminal based on High Efficiency GaN

[Contribution Rate] 1/1

[Lead Institute] Electronics and Telecommunications Research Institute (ETRI)

[Research Period] Mar. 1, 2015 to Feb. 28, 2018

BACKGROUND

Figure 1:
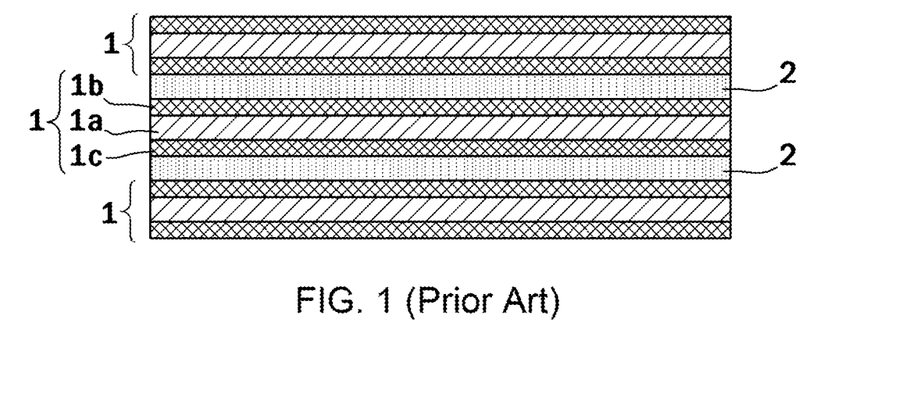
FIG. 1 is a cross-sectional view of a layered structure of a related-art multilayer PCB.

In general, a multilayer PCB having a power semiconductor module package mounted therein has a structure in which a plurality of PCBs 1 having circuit patterns 1a, 1c of copper printed thereon are multi-layered on both side surfaces of a substrate 1a, such as FR-4, CEM-1, CEM-3, Al METAL-PCB, as shown in FIG. 1. The PCBs are configured to be electrically insulated from each other by a pre-preg 2 formed therebetween. An electronic circuit element such as an IC chip, a power semiconductor module package, or the like is mounted on the circuit pattern of the outermost PCB, and a heat radiation structure is additionally installed on a surface of the multilayer PCB structure to discharge heat generated from the electronic circuit element to the outside.

However, according to such a normal multilayer PCB structure, the respective PCBs are stacked in sequence, and accordingly, heat generated from a circuit pattern of a PCB positioned inside is not effectively discharged. In addition, there are disadvantages that, due to the presence of the heat radiation structure installed on the surface of the multilayer PCB, the PCB module has a complicated structure and the volume thereof increases.

SUMMARY

Technical Objects

According to an embodiment of the present disclosure, an object of the present disclosure is to provide a multilayer PCB module structure which can enhance cooling efficiency by rapidly discharging heat generated in a multilayer PCB to the outside through a case, and can achieve compactness and slimness of the PCB module.

Technical Solving Means

According to an embodiment of the present disclosure, there is provided a PCB module having a multi-directional heat radiation structure, the PCB module including: a multilayer PCB assembly including a heat radiation plate layer, and an upper PCB and a lower PCB attached to an upper surface and a lower surface of the heat radiation plate layer, respectively; and an upper case and a lower case configured to cover an upper surface and a lower surface of the multilayer PCB assembly, respectively, wherein the heat radiation plate layer includes a plurality of electrically insulating heat radiation plates arranged on a same plane, wherein at least one heat radiation plate of the plurality of heat radiation plates includes: a first heat pole configured to be in thermal contact with an electronic circuit element mounted on the upper PCB or the lower PCB; and a second heat pole configured to be in thermal contact with an inner surface of at least one of the upper and lower cases.

According to an embodiment of the present disclosure, there is provided a PCB module having a multi-directional heat radiation structure, the PCB module including: a multilayer PCB assembly including a heat radiation plate layer, and an upper PCB and a lower PCB attached to an upper surface and a lower surface of the heat radiation plate layer, respectively; and an upper case and a lower case configured to cover an upper surface and a lower surface of the multilayer PCB assembly, respectively, wherein the heat radiation plate layer includes a plurality of electrically insulating heat radiation plates arranged on a same plane, wherein at least one heat radiation plate of the plurality of heat radiation plates includes a first heat pole configured to be in thermal contact with an electronic circuit element mounted on the upper PCB or the lower PCB, wherein at least one of the upper and lower cases includes a second heat pole configured to be in thermal contact with the at least one heat radiation plate.

According to an embodiment of the present disclosure, there is provided a PCB module having a multi-directional heat radiation structure, the PCB module including: a multilayer PCB assembly having a layered structure in which a plurality of electrically insulating heat radiation plates and a plurality of PCBs are stacked alternately layer by layer; and an upper case and a lower case configured to cover an upper surface and a lower surface of the multilayer PCB assembly, respectively, wherein at least one of an uppermost layer or a lowermost layer of the multilayer PCB assembly is a PCB layer, wherein at least one heat radiation plate of the plurality of heat radiation plates includes: a first heat pole configured to be in thermal contact with an electronic circuit element mounted on the PCB layer of the uppermost layer or the lowermost layer of the multilayer PCB assembly; and a second heat pole configured to be in thermal contact with an inner surface of at least one of the upper and lower cases.

According to an embodiment of the present disclosure, there is provided a multilayer PCB assembly used in a PCB module having a multi-directional heat radiation structure, the multilayer PCB assembly including: an upper PCB including a first circuit pattern of the multilayer PCB assembly; a lower PCB including a second circuit pattern of the multilayer PCB assembly; and a heat radiation plate layer interposed between the upper PCB and the lower PCB, and including a plurality of electrically insulating heat radiation plates arranged on a same plane, wherein at least one heat radiation plate of the plurality of heat radiation plates includes: a first heat pole configured to be in thermal contact with an electronic circuit component mounted on the upper PCB or the lower PCB; and a second heat pole configured to be in thermal contact with a surface of a case covering the upper PCB or the lower PCB.

According to an embodiment of the present disclosure, there is provided a multilayer PCB assembly used in a PCB module having a multi-directional heat radiation structure, wherein the multilayer PCB assembly has a layered structure in which a plurality of electrically insulating heat radiation plates and a plurality of PCBs are stacked alternately layer by layer, wherein at least one of an uppermost layer or a lowermost layer of the multilayer PCB assembly is a PCB layer, wherein at least one heat radiation plate of the plurality of heat radiation plates includes: a first heat pole configured to be in thermal contact with an electronic circuit element mounted on the PCB layer of the uppermost layer or the lowermost layer of the multilayer PCB assembly; and a second heat pole configured to be in thermal contact with an inner surface of at least one case of an upper case and a lower case configured to cover an upper surface and a lower surface of the multilayer PCB assembly, respectively.

Advantageous Effects

According to an embodiment of the present disclosure, a heat radiation plate is interposed between the upper and lower PCBs, and the heat radiation plate is configured to be directly in thermal contact with the case, such that heat generated from the PCBs can be rapidly discharged to the outside and compactness and slimness of the PCB module can be realized.

DETAILED DESCRIPTION

Exemplary embodiments will now be described more fully with reference to the accompanying drawings to clarify aspects, other aspects, features and advantages of the present disclosure. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the present disclosure to those of ordinary skill in the art. In the following description, it will be understood that when an element is referred to as being "on" another element, the element can be directly on another element or intervening elements.

The terms used in the following descriptions are just for explaining embodiments and are not intended to limit the present disclosure. As used herein, the singular forms are intended to include the plural forms as well, unless the context clearly indicates otherwise. It will be understood that the terms "comprises" and/or "comprising," when used in this specification, do not preclude the presence or addition of one or more other components.

Hereinafter, the present disclosure will be described in greater detail with reference to the accompanying drawings. In describing specific embodiments, various specific features are described to assist in a detailed description and a comprehensive understanding of the present invention. However, it is apparent that the exemplary embodiments can be carried out by those of ordinary skill in the art without those specifically defined features. In the description of exemplary embodiments, certain detailed explanations of portions which are well known and have nothing to do with the present invention are omitted when it is deemed that they may unnecessarily obscure the essence of the present invention.

First, a multilayer PCB module 100 according to a first embodiment will be described with reference to FIGS. 2 to FIG. 5.

Figure 2:
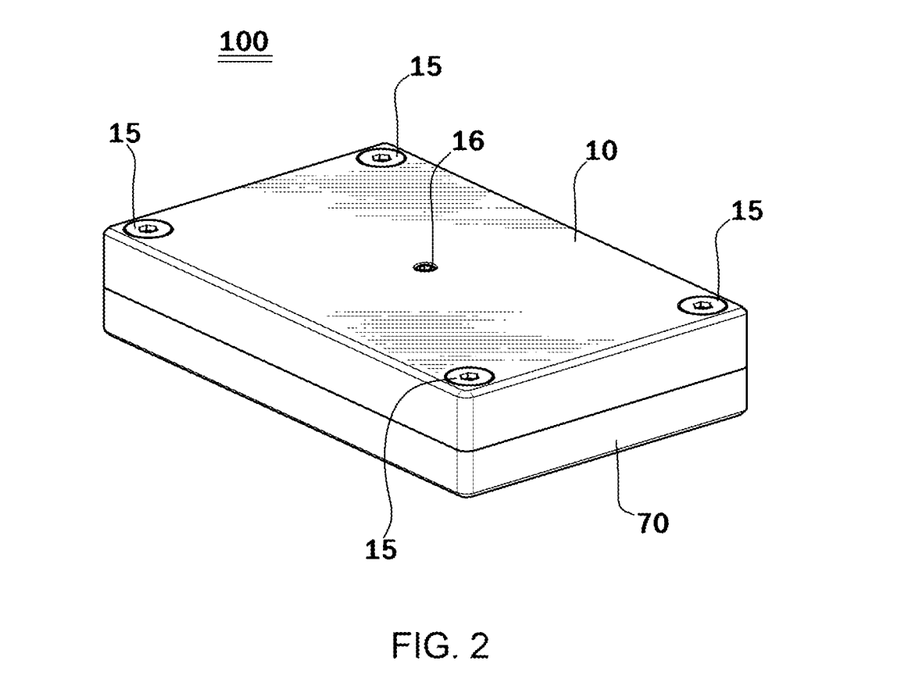
FIG. 2 is a perspective view of a multilayer PCB module according to a first embodiment of the present disclosure.
Figure 3:
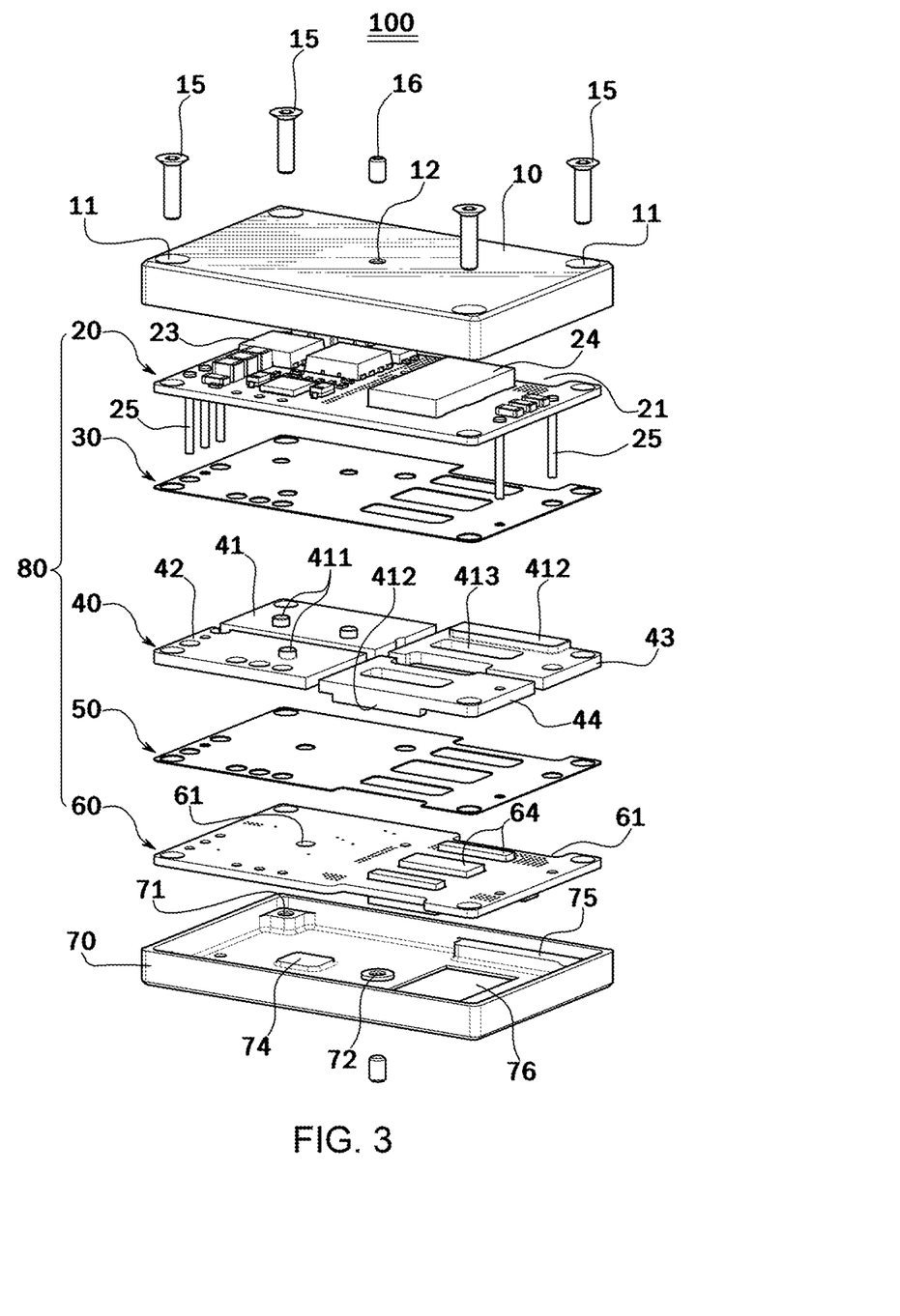
FIG. 3 is an exploded perspective view of the multilayer PCB module according to the first embodiment.
Figure 4:
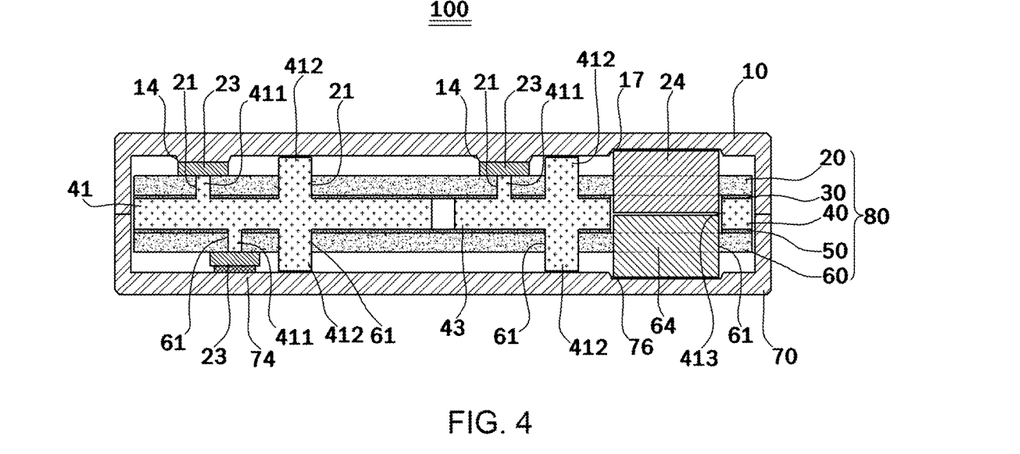
FIG. 4 is a view to illustrate an exemplary cross-sectional structure of the PCB module according to the first embodiment.

FIG. 2 is a perspective view of the multilayer PCB module 100 according to the first embodiment, and FIG. 3 is an exploded perspective view. FIG. 4 is a view to illustrate an exemplary cross-sectional structure of the multilayer PCB module 100 according to the first embodiment. However, FIG. 4 is a schematic representation of elements to easily explain the elements of the PCB module 100, and it should be noted that the structure of FIG. 4 is not identical to the structure of FIG. 3.

Referring to FIG. 2, the multilayer PCB module 100 according to the first embodiment may be packaged in a substantially hexahedral shape, and may be manufactured by coupling an upper case 10 and a lower case 70 in an embodiment. The upper and lower cases 10, 70 may be coupled to each other by fastening means 15, 16 such as bolts or the like. Although not shown in FIG. 2, a plurality of pins (25 of FIG. 3) may protrude to the outside of the multilayer PCB module 100, and the multiplayer PCB module 100 may be electrically connected with an external electronic device through the pins 25.

Referring to FIGS. 3 and 4, the PCB module 100 may have a structure in which the upper case 10 and the lower case 70 are coupled to each other with a multilayer PCB assembly 80 disposed therebetween. The multilayer PCB assembly 80 includes a heat radiation plate layer 40, and an upper PCB 20 and a lower PCB 60 which are coupled to the upper surface and the lower surface of the heat radiation plate layer 40, respectively.

The upper PCB 20 refers to a substrate including a circuit pattern of at least one layer and normally having a multilayer circuit pattern. In an embodiment, the upper PCB 20 may be manufactured with a substrate such as FR-4, CEM-1, CEM-3, Al Metal-PCB, or the like, but the type of the substrate is not limited thereto.

The upper PCB 20 has a penetrating portion 21 formed thereon to allow heat poles 411, 412 protruding from the heat radiation plate layer 40 to penetrate therethrough. The shape or position of the penetration portion 21 may vary according to a circuit design of the PCB 20 in a specific embodiment. A plurality of electronic circuit elements 23, 24 may be mounted on an upper surface of the substrate of the upper PCB 20, and one or more pins 25 may vertically protrude from the surface of the substrate and may be electrically connected with an external electronic device. Herein, the "electronic circuit element" refers to one of various passive elements or active elements, and various types of IC chips having these elements integrated thereinto.

The lower PCB 60 has the same or similar structure as or to that of the upper PCB 20. The lower PCB 60 may have a circuit pattern of at least one layer, and normally, may have a multilayer circuit pattern. The lower PCB 60 has a penetrating portion 61 formed thereon to allow the heat poles 411, 412 protruding from the heat radiation plate layer 40 to penetrate therethrough, and the shape or position of the penetrating portion 61 may vary according to a circuit design of the PCB 60. A plurality of electronic circuit elements 23, 64 may be mounted on a surface of the substrate of the lower PCB 60.

The upper PCB 20 and the lower PCB 60 may be coupled to each other with the heat radiation plate layer 40 disposed therebetween, thereby forming the multilayer PCB assembly 80 of one unit. In this case, an electrically insulating pre-preg 30 may be interposed between the upper PCB 20 and the heat radiation plate layer 40, and an electrically insulating pre-preg 50 may be interposed between the lower PCB 60 and the heat radiation plate layer 40 and may be coupled thereto. The pre-pregs 30, 50 may be formed with a material having an electrical insulating property and having no heat blocking property or a low heat blocking property. Accordingly, heat generated from the upper or lower PCB 20, 60 may be well transmitted to the heat radiation plate layer 40.

The heat radiation plate layer 40 may include a plurality of electrically insulating heat radiation plates 41, 42, 43, 44 arranged on the same plane. For example, the heat radiation plate layer 40 in FIG. 3 may include four heat radiation plates 41-44 each being formed in a substantially rectangular plate shape. The number and shapes of the heat radiation plates forming the heat radiation plate layer 40 may vary according to a specific embodiment.

The respective heat radiation plates 41-44 are arranged between the upper PCB 20 and the lower PCB 60, and perform a function of absorbing heat generated in the respective PCBs 20, 60 through various paths and discharging the heat to the cases 10, 70. To achieve this, the respective heat radiation plates may be formed with a material having a high thermal conductivity, such as copper (Cu), aluminum (Al), silicon carbide (SiC), aluminum nitride (AlN), or the like. In an embodiment, a heat radiation plate having a high thermal conductivity while having an electrical insulating property may be manufactured by performing anodizing treatment with respect to an aluminum plate.

At least one of the plurality of heat radiation plates 41-44 may include one or more heat poles 411, 412 formed on upper and lower surfaces thereof. The heat poles 411, 412 are protrusions protruding vertically from the upper and lower surfaces of the heat radiation plate and formed in the form of a pillar having a circular or polygonal cross section.

In the illustrated embodiment, the heat poles include a first heat pole 411 and a second heat pole 412. The first heat pole 411 is a protrusion that protrudes from the surface of the heat radiation plate and has a predetermined first height. As shown in FIG. 4, in an embodiment, the first heat pole 411 may protrude to penetrate through the penetrating portions 21, 61 of the PCBs 20, 60 when the upper and lower PCBs 20, 60 are coupled to the heat radiation plate, and to have the same height as the surface of the PCB. Accordingly, the first heat pole 411 may be in thermal contact with the electronic circuit element 23 mounted on the surface of the upper or lower PCB 20, 60.

The second heat pole 412 is a protrusion that protrudes from the surface of the radiation heat plate and has a predetermined second height, and normally may protrude higher than the first heat pole 411. As shown in FIG. 4, the second heat pole 412 may protrude to a height so as to penetrate through the penetrating portions 21, 61 of the PCBs 20, 60 when the upper and lower PCBs 20, 60 and the upper and lower cases 10, 70 are coupled to each other, and to be in thermal contact with inner surfaces of the cases 10, 70.

According to the configuration of the first and second heat poles 411, 412 described above, heat generated from the electronic circuit element 23 may be absorbed into the first heat pole 411 and may be transmitted to the heat radiation plates 41-44. The heat may be transmitted to the cases 10, 70 through the second heat pole 412 and may be discharged to the outside.

A portion of the plurality of heat radiation plates may be configured to include only one of the first heat pole 411 or the second heat pole 412. The other portion of the plurality of heat radiation plates may be configured to include both the first and second heat poles 411, 412. The number and shapes of the first heat pole 411 and/or the second heat pole 412 formed on the respective heat radiation plates may be determined according to a specific circuit design.

In the illustrated embodiment, at least one heat radiation plate 43, 44 from among the plurality of heat radiation plates may further include one or more penetration regions 413 penetrating through the upper and lower surfaces of the heat radiation plate. The penetrating region 413 is formed to provide a contact point or a contact area to allow the electronic circuit elements mounted on the upper PCB 20 and the lower PCB 60 to be in physical or electrical contact with each other.

For example, referring to FIGS. 3 and 4, each of the electronic circuit element 24 mounted on the upper PCB 20 and the electronic circuit element 64 mounted on the lower PCB 60 may be a part of a coil, and the two circuit elements 24, 64 may come into physical or electrical contact with each other through the penetrating region 413 of the heat radiation plate 43, 44 when the upper PCB 20 and the lower PCB 60 are coupled to each other, and may entirely function as coils. Some of the electronic circuit elements mounted on the upper PCB 20 or the lower PCB 60 may perform their specific functions only when the upper PCB 20 and the lower PCB 60 are coupled to each other and are assembled into the multilayer PCB assembly 80.

Figure 5:
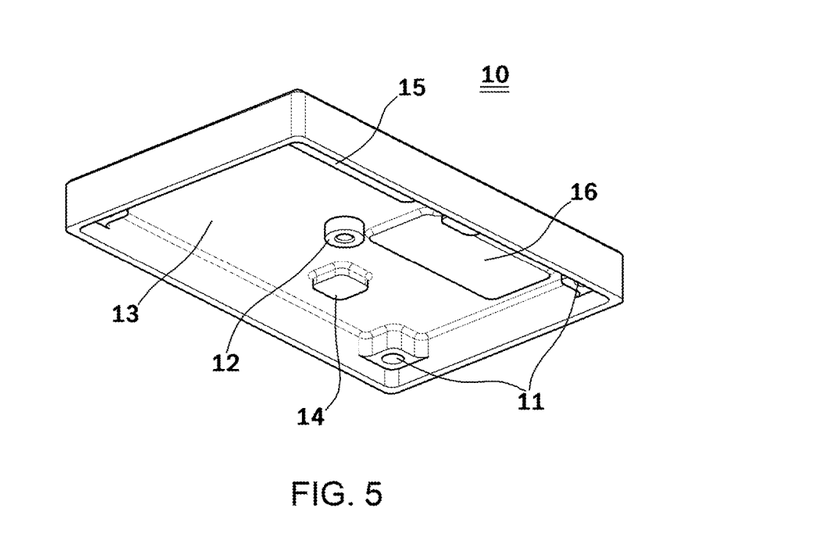
FIG. 5 is a perspective view of a bottom of an upper case according to the first embodiment.

Hereinafter, the upper and lower cases 10, 70 will be described in detail with reference to FIGS. 3 to 5. FIG. 5 is a perspective view of a bottom surface of the upper case 10 according to an embodiment, as viewed under the upper case 10 of FIG. 3.

The upper and lower cases 10, 70 are coupled to each other while covering the surfaces of the upper PCB 20 and the lower PCB 60, and absorb heat generated from the respective PCBs 20, 60 and heat transmitted from the heat radiation plate layer 40, and discharge the heat to the outside. The upper and lower cases 10, 70 may perform a heat sink function by themselves, and may be coupled with another external heat sink to transmit the heat to the external heat sink.

To achieve this, the upper and lower cases 10, 70 may be manufactured with a material having a high thermal conductivity, such as copper (Cu), aluminum (Al), silicon carbide (SiC), aluminum nitride (AlN), or the like. In an embodiment, the cases 10, 70 having a high thermal conductivity while having an electrical insulating property may be manufactured by performing anodizing treatment with respect to an aluminum case.

The upper case 10 covers the upper portion and a part of the side surfaces of the multilayer PCB assembly 80, and the lower case 70 covers the lower portion and a part of the side surfaces of the multilayer PCB assembly 80.

The upper and lower cases 10, 70 may include first contact regions 14, 16, 17, 74, 76 formed on inner surfaces thereof to be in thermal contact with the electronic circuit elements 23, 24, 64 mounted on the upper PCB 20 or the lower PCB 60.

Figure 6:
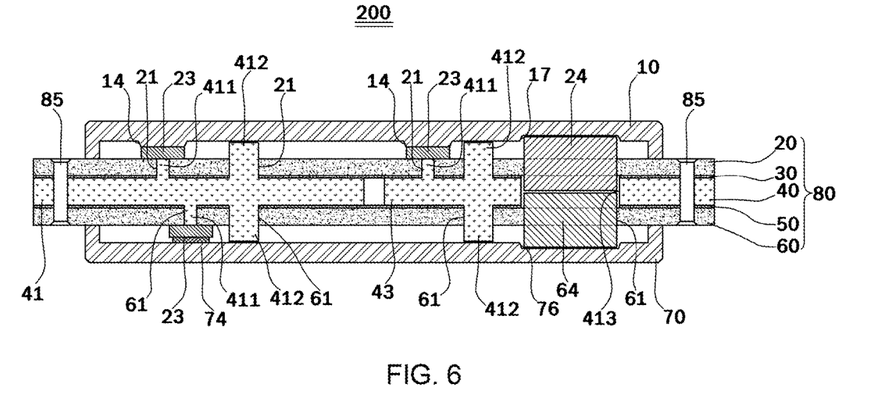
FIGS. 6, 7 and 8 are views to illustrate exemplary cross-sectional structures of PCB modules according to variations of the first embodiment.

For example, the first contact region 14, 16 of the upper case 10 is a region which is in contact with the electronic circuit element 23 mounted on the upper PCB 20, and for example, as shown in FIG. 6, the contact regions 14, 16 may be protrusions that protrude from the inner surface 13 of the case 10. The contact regions 14, 16 formed in the form of a protrusion may integrally extend from the inner surface 13 of the case 10 and protrude above the surface as shown in FIG. 4.

In another example, another contact region 17 from among the first contact regions may be a recess portion that has a lower height than the internal surface of the case 10 as shown in FIG. 4, and for example, may be in contact with the electronic circuit element 24 having a relatively large volume like a coil. As described above, whether the first contact region is the protrusion or the recess portion is related to the volume (or height) of an electronic circuit element in contact with the corresponding contact region, and thus specific specifications of the first contact regions, such as the shapes, number, positions, or the like may vary according to a specific embodiment.

Referring to FIG. 3, similarly, the lower case 70 may have the first contact regions 74, 76 formed thereon, and in the illustrated embodiment, the contact region 74 is a protrusion and the contact region 76 is a recess portion. In addition, as shown in FIGS. 3 and 4, the contact region 74 formed in the form of a protrusion may be formed by attaching a member of a different material from that of the lower case 70 to a surface 73 of the lower case 70, and may be implemented by using a thermal conductive member such as a thermal pad, for example.

In addition, as shown in FIGS. 3 and 5, the upper and lower cases 10, 70 may further include second contact regions 15, 75 formed on the inner surfaces thereof to be in thermal contact with the second heat poles 412 protruding from the heat radiation plates. The second contact regions 15, 75 may protrude from the inner surfaces 13, 73 of the cases 10, 70 with stepped portions according to the height or shapes of the second heat poles 412, or may have the same surfaces height as the inner surfaces 13, 73, and it will be understood that the shapes, number, or positions of the second contact regions may vary according to a specific embodiment.

According to the configuration of the multilayer PCB assembly 80 and the cases 10, 70 surrounding the same as described above, heat generated from the PCBs may be discharged to the outside of the PCB module 100 via various paths as explained below.

First, heat generated from the electronic circuit elements 23, 24, 26 mounted on the upper PCB 20 and the lower PCB 60 may be transmitted to the first heat poles 411 formed on the heat radiation plates 41-44 of the heat radiation plate layer 40. Since the first heat poles 411 are directly in thermal contact with the electronic circuit elements 23, 24, 64 through the substrates of the PCBs 20, 60, the first heat poles 411 can more rapidly absorb heat from the electronic circuit elements than in the prior art.

Second, heat absorbed from the upper and lower PCBs 20, 60 by the heat radiation plates 41-44 may be transmitted to the upper and lower cases 10, 70 through the second heat poles 412 of the heat radiation plates, and may be discharged to the outside of the PCB module 100. Since the second heat poles 412 are directly in thermal contact with the upper and lower cases 10, 70 through the substrates of the PCBs 20, 60, the second heat poles 412 can more rapidly discharge heat from the heat radiation plates to the cases 10, 70 than in the prior art.

Third, the heat generated from the electronic circuit elements mounted on the upper PCB 20 and the lower PCB 60 may be transmitted to the cases 10, 70 through the first contact regions 14, 16, 17, 74, 76 of the upper and lower cases 10, 70, in addition to the first heat poles 411. As shown in FIG. 4, one side surface of the electronic circuit element is in contact with the first heat pole 411 and discharges heat to the first heat pole 411, and the other side surface is directly in thermal contact with the first contact region 14, 17, 74, 76 of the case 10, 70, and discharges heat through the first region. That is, since both side surfaces of the electronic circuit element mounted on the PCB 20, 60 are in contact with heat transmission members, heat can be more rapidly discharged than in the prior art.

According to the configuration of the multilayer PCB assembly 80 and the cases 10, 70 according to the present disclosure as described above, the PCB module 100 has a multi-direction heat radiation structure capable of discharging heat via various paths. In addition, as an additional effect according to such a configuration, the inner space of the PCB module 100 can be greatly reduced and thus there is a technical effect of manufacturing a compact and slim PCB module.

For example, if it is assumed that a TO-220 chip is mounted as an electronic circuit element to be mounted on the PCBs 20, 60, the TO-220 chip may be mounted in a multilayer PCB substrate in an upright position in the prior art, and heat generated from the chip may be transmitted to a case through an inner space (filled with air) of the case and is discharged to the outside of the case. However, according to the embodiment of the present disclosure described above, the TO-220 chip may be laid in the horizontal direction and may be mounted in the PCBs 20, 60 to have one side surface thereof be in contact with the first heat pole 411 and the other side surface be in contact with the first contact region 14, 74. Accordingly, since the chip can be laid in the horizontal direction, the inner empty space of the PCB module 100 can be greatly reduced, and thickness of the module 10 can be made slim. In addition, heat generated from the chip can be discharged more rapidly through the heat radiation plate layer 40 and the cases 10, 70 disposed on both side surfaces of the chip.

Therefore, when the present disclosure is applied to a high power element package, for example, electronic elements can be integrated. According to results of an experiment conducted by applying the configuration of the PCB module 100 of the present disclosure described above to an on board charger (OBC) for cars, a volume of a 13 KW OBC device was 20 liters when a related-art multilayer PCB structure was used, but, when the PCB module configuration of the present disclosure was applied, it was identified that the volume was greatly reduced to 6 liters and heat radiation efficiency increased by 30-40% in comparison to the related-art structure.

Hereinafter, various variations of the PCB module 100 according to the present disclosure will be described briefly with reference to FIGS. 6 to 8.

FIG. 6 is a view schematically illustrating an exemplary cross-sectional structure of a PCB module 200 according to another variation. Compared to the PCB module 100 of FIG. 4, the module 200 of FIG. 6 has the substantially same or similar inner structure as or to that of the module 100, and thus a description thereof is omitted. However, the upper and lower cases 10, 70 of the PCB module 200 of FIG. 6 do not cover side surfaces of the multilayer PCB assembly 80, and cover the upper surface and the lower surface of the multilayer PCB assembly 80.

Regions of the multilayer PCB assembly 80 that are not covered by the cases 10, 70 may protrude from sides of the cases 10, 70 as shown in the drawings, and penetrating holes 85 may be formed on the protruding regions. The penetrating holes 85 are to connect to another device, for example, and the multilayer PCB assembly 80 may be electrically or physically connected with another electronic device outside the PCB module 200 through the penetrating holes 85.

Figure 7:
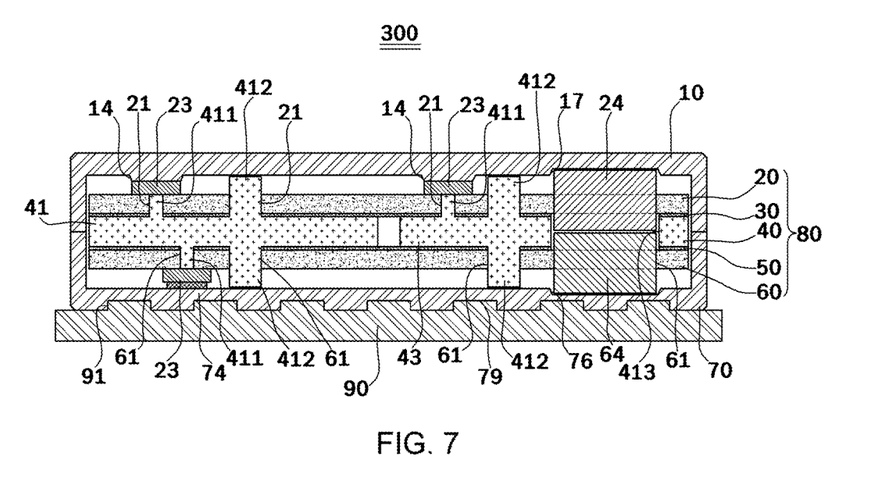

FIG. 7 is a view schematically illustrating an exemplary cross-sectional structure of a PCB module 300 according to still another variation. Compared to the PCB module 100 of FIG. 4, the module 300 of FIG. 7 has the substantially same or similar inner structure as or to that of the module 100, and thus a description thereof is omitted. However, in the embodiment of FIG. 7, a first concavo-convex shape 79 may be formed on an outer surface of the lower case 70 of the PCB module 30, and an additional heat radiation structure 90 may be attached to the outer surface of the lower case 70. A second concavo-convex shape 91 may be formed on a surface of the heat radiation structure 90 to be engaged with the first concavo-convex shape 79 in contact therewith, and according to this configuration, heat from the lower case 70 may be discharged to the outside more rapidly.

Although FIG. 7 depicts that the heat radiation structure 90 is attached to the lower case 70, the heat radiation structure 90 may also be attached to the upper case 10, for example. In addition, the concavo-convex shapes 79, 91 may be formed between the case 10, 70 and the heat radiation structure 90 or the concavo-convex shapes 79, 91 may be omitted.

Figure 8:
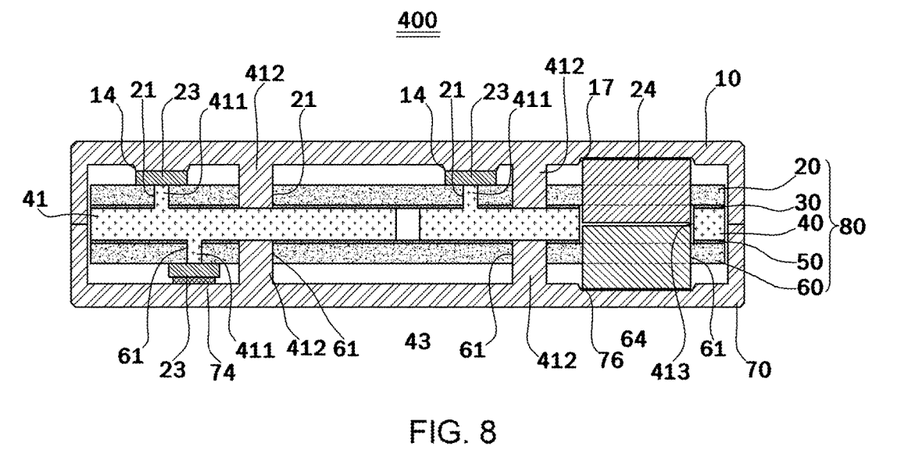

FIG. 8 is a view schematically illustrating an exemplary cross-sectional structure of a PCB module 400 according to yet another variation. Compared to the PCB module 100 of FIG. 4, the module 400 of FIG. 8 has the substantially same or similar inner structure as or to that of the module 100. However, in the embodiment of FIG. 8, the second heat pole 412 may be formed on an inner surface of at least one of the upper and lower cases 10, 70 of the PCB module 400 to be in thermal contact with at least one heat radiation plate of the heat radiation plate layer 40. That is, in the PCB module 400 of FIG. 8, the second heat pole 412 connecting the heat radiation plate layer 40 and the case 10, 70 is formed on the case 10, 70.

Therefore, the second heat pole 412 thermally connecting the heat radiation plate layer 40 and the case 10, 70 may be formed on any one of the heat radiation plate or the case. It will be understood by a person skilled in the related art that, in an alternative embodiment, the second heat pole 412 may be formed as an independent member separate from the heat radiation plate or the case 10, 70, and then may have both end surfaces coupled to the heat radiation plate or the case.

Figure 9:
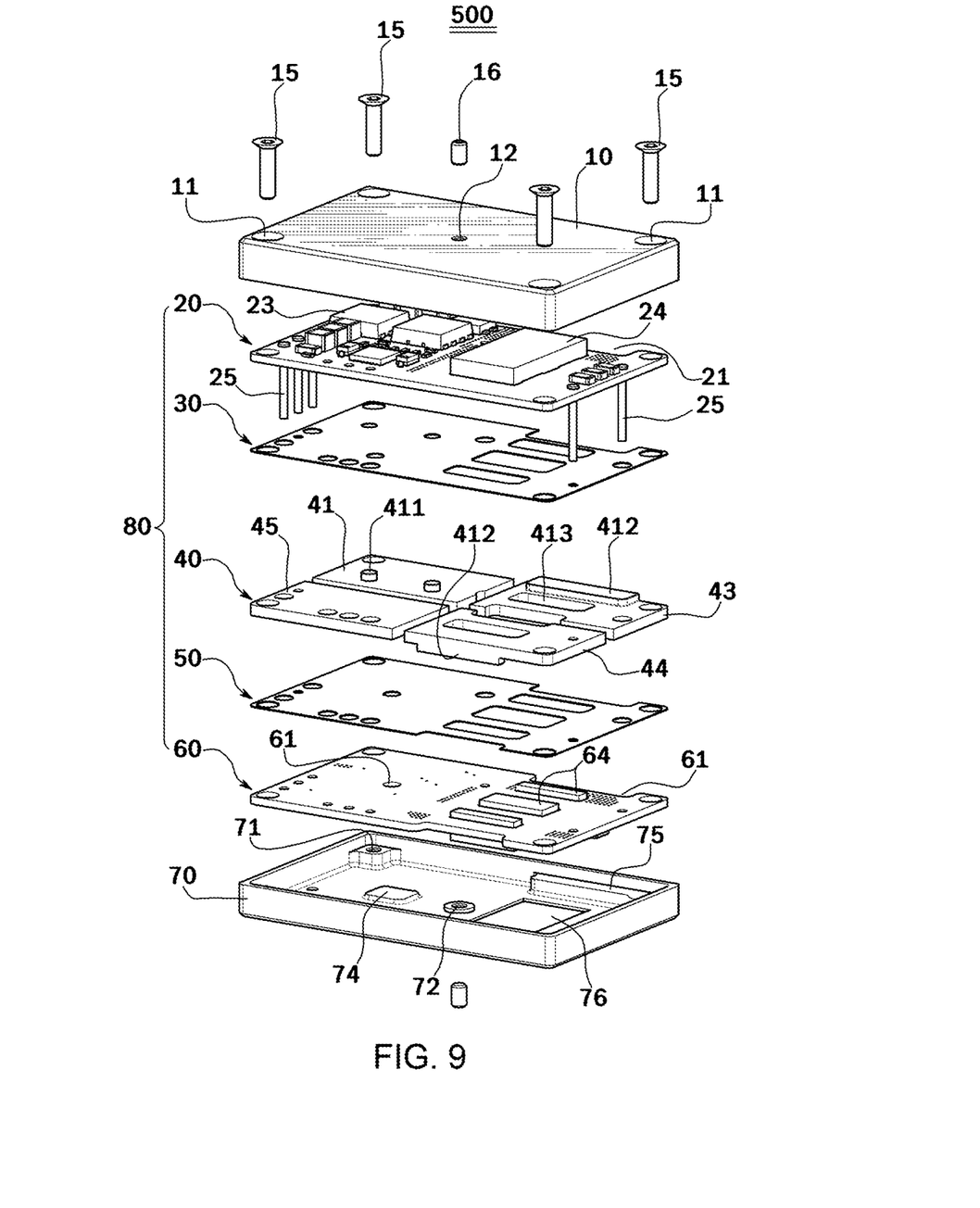
FIG. 9 is an exploded perspective view of a multilayer PCB module according to a second embodiment.
Figure 10:
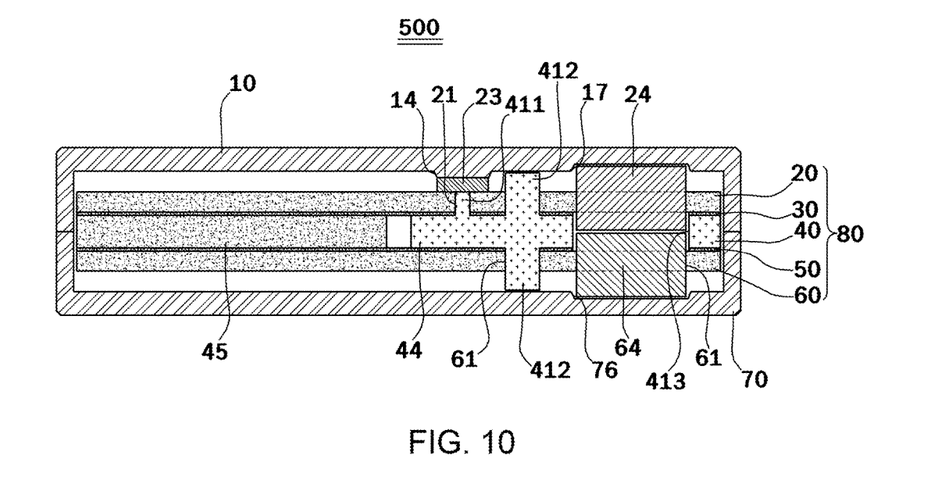
FIG. 10 is a view to illustrate an exemplary cross-sectional structure of the PCB module according to the second embodiment.

FIG. 9 is an exploded perspective view of a multilayer PCB module 500 according to a second embodiment, and FIG. 10 is a view to illustrate an exemplary cross-sectional structure of the PCB module 500.

Referring to FIGS. 9 and 10, the PCB module 500 of the second embodiment may have a structure in which an upper case 10 and a lower case 70 are coupled to each other with a multilayer PCB assembly 80 being disposed therebetween. The multilayer PCB assembly 80 includes a heat radiation plate 40, and an upper PCB 20 and a lower PCB 60 which are coupled to the upper surface and the lower surface of the heat radiation plate layer 40, respectively.

Compared to the module 100 of the first embodiment of FIGS. 3 and 4, the module 500 of the second embodiment and the multilayer PCB assembly 80 have the same or similar configuration as or to that of the module 100 of the first embodiment, and detailed descriptions of the multilayer PCB assembly 80, the upper case 10, and the lower case 70 are omitted.

However, as shown in FIG. 9, the heat radiation plate layer 40 in the module 500 of the second embodiment includes a plurality of heat radiation plates 41, 43, 44, and at least one PCB 45 arranged on the same plane as that of the plurality of heat radiation plates. That is, compared to the first embodiment, some of the plurality of heat radiation plates are substituted with the PCB 45. The substituted PCB 45 may be a substrate having a circuit pattern of at least one layer formed on a surface and/or an inside thereof.

A certain circuit pattern of the PCB 45 interposed between the upper PCB 20 and the lower PCB 60 may be electrically connected with a certain circuit pattern of the upper and/or lower PCB 20, 60 by means of a connecting means such as a through hole (not shown) although it is not illustrated.

Figure 11:
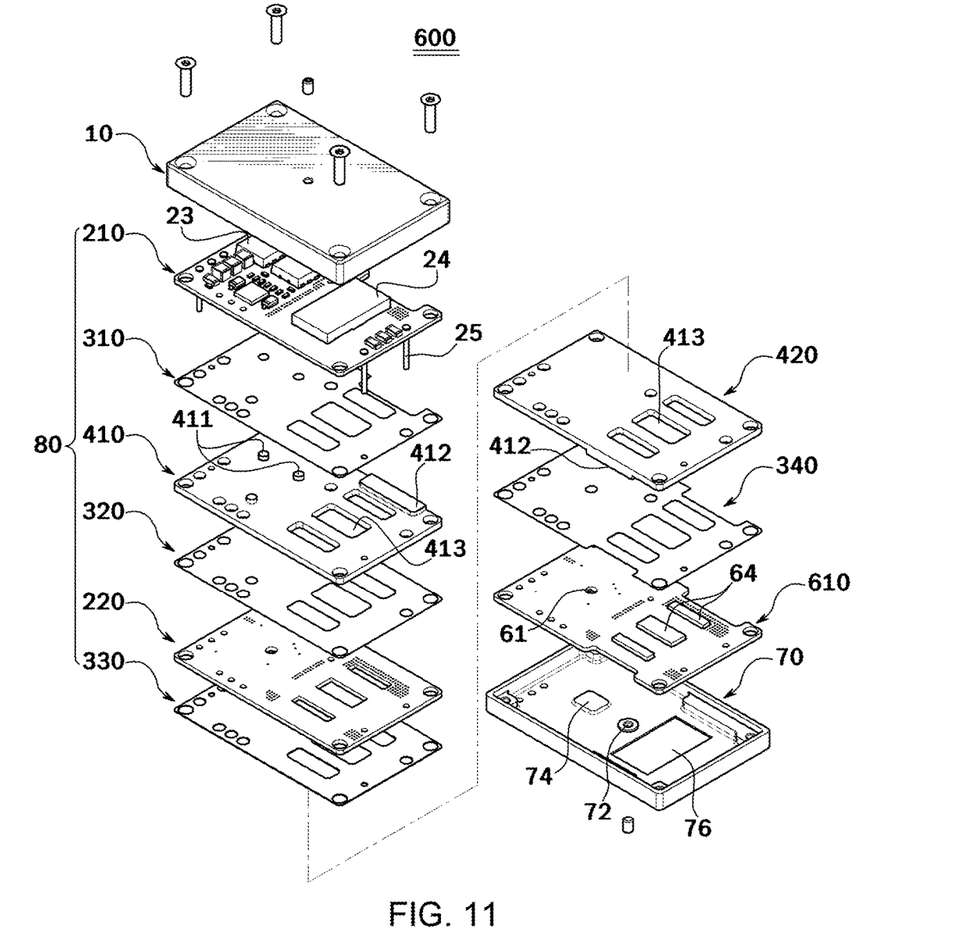
FIG. 11 is an exploded perspective view of a multilayer PCB module according to a third embodiment.
Figure 12:
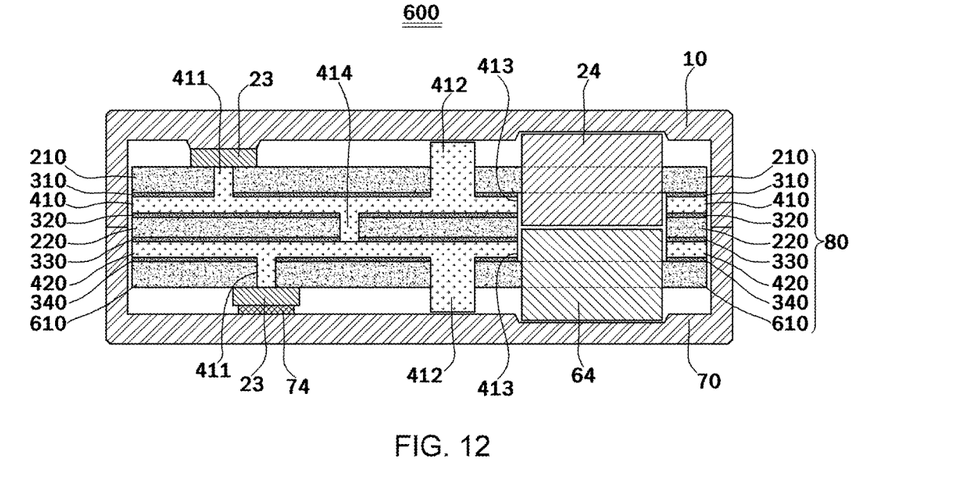
FIG. 12 is a view to illustrate an exemplary cross-sectional structure of the PCB module according to the third embodiment.

FIG. 11 is an exploded perspective view of a multilayer PCB module 600 according to a third embodiment, and FIG. 12 is a view to illustrate an exemplary cross-sectional structure of the PCB module 600.

Referring to FIGS. 11 and 12, the PCB module 600 of the third embodiment may have a structure in which an upper case 10 and a lower case 70 are coupled to each other with a multilayer PCB assembly 80 being disposed therebetween, and the upper case 10 and the lower case 70 are the same or similar as or to those of the first embodiment, and thus a detailed description thereof is omitted.

However, as shown in FIGS. 12 and 13, the multilayer PCB assembly 80 of the module 600 of the third embodiment may have a structure in which a plurality of PCB layers and a plurality of heat radiation plate layers are stacked. That is, in the illustrated embodiment, the multilayer PCB assembly 80 may have a layered structure in which a plurality of electrically insulating heat radiation plates 410, 420 and a plurality of PCBs 210, 220, 610 are stacked alternately layer by layer. In addition, in the layered structure of the heat radiation plates and the PCBs, a pre-preg layer 310, 320, 330, 340 may be interposed between each of the heat radiation plates 410, 420 and each of the PCBs 210, 220, 610.

In an embodiment, at least one of the uppermost layer or the lowermost layer of the multilayer PCB assembly 80 may be a PCB layer. For example, in the illustrated embodiment, the uppermost layer and the lowermost layer of the multilayer PCB assembly 80 are comprised of the PCBs 210, 610, and one or more electronic circuit elements 23, 24, 64 may be mounted on the surfaces of the PCBs 210, 610 of the uppermost layer and the lowermost layer.

The heat radiation plate 410 disposed under the PCB 210 of the uppermost layer may include a first heat pole 411 to be in thermal contact with the electronic circuit elements 23, 24 mounted on the uppermost layer PCB 210, and a second heat pole 412 to be in thermal contact with an inner surface of the upper case 10.

Likewise, the heat radiation plate 420 disposed on the lowermost layer PCB 610 may include a first heat pole 411 to be in thermal contact with the electronic circuit elements 23, 64 mounted on the lowermost layer PCB 610, and a second heat pole 412 to be in thermal contact with an inner surface of the lower case 70.

In addition, in the illustrated embodiment, at least one heat radiation plate 410 of the heat radiation plates may further include a third heat pole 414 to be in thermal contact with the heat radiation plate 420 adjacent to the heat radiation plate 410 with the PCB 220 being interposed therebetween. Although it is illustrated that the third heat pole 414 is formed on the upper heat radiation plate 410, the third heat pole 414 may be formed on the lower plate 420 in an alternative embodiment. One or more penetrating portions 21, 61 may be formed on the uppermost layer or lowermost layer PCB to allow the first heat pole 411 and/or the second heat pole 411 to penetrate and to be inserted therethrough. The first heat pole 411 may protrude to the same height as the surface of the uppermost layer or lowermost layer PCB 210, 610, and accordingly, the first heat pole 411 may be in thermal contact with the electronic circuit element 23 mounted on the surface of the PCB 210, 610 to be able to absorb heat from the electronic component element.

In addition, the second heat pole 412 may protrude to a height to come into contact with the inner surface of the upper case 10 or the lower case 70, and accordingly, can discharge heat from the heat radiation plates 410, 420 to the upper and lower cases 10, 70.

It will be understood by those skilled in the art that various modifications and changes can be made based on the detailed descriptions of the present disclosure as above. For example, the configuration in which the heat radiation plate layer 40 includes the plurality of heat radiation plates arranged on the same plane as described in the first and second embodiments of FIGS. 3 to 10 can be applied to the third embodiment. In this case, at least one PCB layer of the PCBs 210, 220, 610 of FIG. 11 or 12 may include a plurality of heat radiation plates.

In addition, the configurations of the variations of FIGS. 6 to 8 can be applied to the third embodiment. For example, an additional heat radiation structure may be attached to an outer surface of at least one case of the upper and lower cases 10, 70 in FIG. 12, and a concavo-convex shape may be formed between the at least one case and the heat radiation structure.

Therefore, the scope of the present disclosure should be defined not by the detailed description, but by the appended claims and the equivalent of the claims.

What is claimed is:

1. A PCB module having a multi-directional heat radiation structure, the PCB module comprising: a multilayer PCB assembly comprising a heat radiation plate layer, and an upper PCB and a lower PCB attached to an upper surface and a lower surface of the heat radiation plate layer, respectively; and an upper case and a lower case configured to cover an upper surface and a lower surface of the multilayer PCB assembly, respectively, wherein the heat radiation plate layer comprises a plurality of electrically insulating heat radiation plates arranged on a same plane, wherein at least one heat radiation plate of the plurality of heat radiation plates comprises: a first heat pole configured to be in thermal contact with an electronic circuit element mounted on the upper PCB or the lower PCB; and a second heat pole configured to be in thermal contact with an inner surface of at least one of the upper and lower cases, wherein a first concavo-convex shape is formed on an outer surface of at least one case of the upper and lower cases, and wherein the PCB module further comprises a heat radiation structure having a second concavo-convex shape attached to the outer surface of the at least one case to be engaged with the first concavo-convex shape in contact therewith.

2. The PCB module of claim 1, wherein at least one of the upper case and the lower case comprise a contact region, and the contact region is formed on an inner surface of at least one of the upper case and the lower case to be in thermal contact with an electronic component mounted on the upper PCB or the lower PCB.

3. The PCB module of claim 2, wherein the contact region comprises a thermal pad.

4. The PCB module of claim 1, where one or more penetrating regions are formed on the at least one heat radiation plate to penetrate through an upper surface and a lower surface of the at least one heat radiation plate, and wherein the multilayer PCB assembly comprises one or more contact points or contact areas which come into physical or electrical contact between the upper PCB and the lower PCB through the penetrating regions of the at least one heat radiation plate.

5. The PCB module of claim 1, further comprising: an upper pre-preg which is interposed between the heat radiation plate layer and the upper PCB, and has an electrical insulating property; and a lower pre-preg which is interposed between the heat radiation plate layer and the lower PCB, and has an electrical insulating property.

6. The PCB module of claim 1, wherein the first heat radiation plate layer further comprises at least one PCB arranged on the same plane as the plurality of heat radiation plates, and wherein a circuit pattern of at least one layer is formed on the at least one PCB.

7. A PCB module having a multi-directional heat radiation structure, the PCB module comprising: a multilayer PCB assembly comprising a heat radiation plate layer, and an upper PCB and a lower PCB attached to an upper surface and a lower surface of the heat radiation plate layer, respectively; and an upper case and a lower case configured to cover an upper surface and a lower surface of the multilayer PCB assembly, respectively, wherein the heat radiation plate layer comprises a plurality of electrically insulating heat radiation plates arranged on a same plane, wherein at least one heat radiation plate of the plurality of heat radiation plates comprises a first heat pole configured to be in thermal contact with an electronic circuit element mounted on the upper PCB or the lower PCB, wherein at least one of the upper and lower cases comprises a second heat pole configured to be in thermal contact with the at least one heat radiation plate.

8. The PCB module of claim 7, further comprising a contact region formed on an inner surface of at least one of the upper case and the lower case to be in thermal contact with an electronic component mounted on the upper PCB or the lower PCB.

9. The PCB module of claim 7, wherein one or more penetration portions are formed on at least one of the upper PCB and the lower PCB to allow the first heat pole or the second heat pole to penetrate therethrough.

10. The PCB module of claim 7, further comprising: an upper pre-preg which is interposed between the heat radiation plate layer and the upper PCB, and has an electrical insulating property; and a lower pre-preg which is interposed between the heat radiation plate layer and the lower PCB, and has an electrical insulating property.

11. The PCB module of claim 7, wherein the heat radiation plate layer further comprises at least one PCB arranged on the same plane as the plurality of heat radiation plates, and wherein a circuit pattern of at least one layer is formed on the at least one PCB.

12. A PCB module having a multi-directional heat radiation structure, the PCB module comprising: a multilayer PCB assembly having a layered structure in which a plurality of electrically insulating heat radiation plates and a plurality of PCBs are stacked alternately layer by layer; and an upper case and a lower case configured to cover an upper surface and a lower surface of the multilayer PCB assembly, respectively, wherein at least one of an uppermost layer or a lowermost layer of the multilayer PCB assembly is a PCB layer, wherein at least one heat radiation plate of the plurality of heat radiation plates comprises: a first heat pole configured to be in thermal contact with an electronic circuit element mounted on the PCB layer of the uppermost layer or the lowermost layer of the multilayer PCB assembly; and a second heat pole configured to be in thermal contact with an inner surface of at least one of the upper and lower cases, wherein a first concavo-convex shape is formed on an outer surface of at least one case of the upper and lower cases, and wherein the PCB module further comprises a heat radiation structure having a second concavo-convex shape attached to the outer surface of the at least one case to be engaged with the first concavo-convex shape in contact therewith.

13. The PCB module of claim 12, further comprising a contact region formed on an inner surface of at least one of the upper case and the lower case to be in thermal contact with an electronic circuit element mounted on the PCB layer of the uppermost layer or the lowermost layer.

14. The PCB module of claim 12, wherein one or more penetrating portions are formed on the PCB layer of the uppermost layer or the lowermost layer to allow the first heat pole or the second heat pole to penetrate therethrough, and wherein the first heat pole protrudes to a same height as a surface of the PCB layer of the uppermost layer or the lowermost layer, and the second heat pole protrudes to a height to be in contact with an inner surface of the upper case or the lower case.

15. The PCB module of claim 12, wherein a pre-preg layer is interposed between each of the heat radiation plates and each of the PCBs in the layered structure of the heat radiation plates and the PCBs.

* * * * *